United States Patent

Johannsmeier

[15] 3,705,769

[45] Dec. 12, 1972

[54] OPTICAL ALIGNMENT AND CONTACT PRINTING SYSTEM WITH IMPROVED CHUCK ASSEMBLY

[72] Inventor: Karl-Heinz Johannsmeier, 555 W. Middlefield Rd., Mountain View, Calif. 94040

[22] Filed: Nov. 12, 1970

[21] Appl. No.: 88,973

[52] U.S. Cl. .......................................355/91, 355/78

[51] Int. Cl. .............................................G03b 27/20

[58] Field of Search ................355/78, 91, 93, 94, 92

[56] References Cited

UNITED STATES PATENTS

| | | | |
|---|---|---|---|
| 3,521,953 | 7/1970 | Tancredi | 355/78 |
| 3,306,176 | 2/1967 | Myers | 355/91 |
| 3,399,593 | 9/1968 | Delp | 355/85 X |
| 3,280,715 | 10/1966 | Corl et al. | 355/85 |
| 3,192,844 | 7/1965 | Szasz et al. | 355/78 |

*Primary Examiner*—Samuel S. Matthews
*Assistant Examiner*—Richard L. Moses
*Attorney*—Roland I. Griffin

[57] ABSTRACT

A semiconductor wafer is loaded onto a pivotally-mounted portion of a chuck assembly and held in place by application of a vacuum to the lower surface of the wafer. The chuck assembly is then driven upward under fluid pressure to position the upper surface of the wafer in abutment upon the lower surface of a mask supported on a holder above the chuck assembly and to thereby align these surfaces in parallel planes. After this parallel plane alignment operation, the chuck assembly is lowered and moved relative to the mask holder to align a pattern on the upper surface of the wafer with a corresponding pattern on the lower surface of the mask. Once this pattern alignment operation has been completed, the chuck assembly is again driven upward under fluid pressure to position the upper surface of the wafer in abutment upon the lower surface of the mask. A first normally retracted seal ring supported by the chuck assembly around the wafer is then inflated to sealingly engage the lower surface of the mask. The region enclosed by the mask, the first seal ring, and the chuck assembly is thereupon evacuated clamping the chuck assembly, the wafer, and the mask together and permitting equalization of the pressure applied to the chuck assembly and the mask. A second normally retraced seal ring supported by the chuck assembly within the first seal ring beneath a peripheral portion of the wafer may also be inflated to sealingly engage the lower surface of the wafer. In this case, the region enclosed by the mask, the first seal ring, the portion of the chuck assembly between the first and second seal rings, the second seal ring, and the wafer is evacuated clamping the chuck assembly, the wafer, and the mask together and permitting equalization of the pressure applied to the wafer and the mask. In either case, a photosensitive film on the upper surface of the wafer is then exposed through the mask, the seal or seals deflated, the chuck assembly lowered, and the exposed wafer unloaded.

30 Claims, 8 Drawing Figures

PATENTED DEC 12 1972

3,705,769

5 Sheets-Sheet 1

INVENTOR.
KARL-HEINZ JOHANNSMEIER

BY Roland I. Griffin

ATTORNEY

PATENTED DEC 12 1972

3,705,769

5 Sheets-Sheet 2

INVENTOR
KARL-HEINZ JOHANNSMEIER

BY Roland D. Griffin

ATTORNEY

INVENTOR
KARL-HEINZ JOHANNSMEIEF
BY Roland I. Griffin
ATTORNEY

INVENTOR
KARL-HEINZ JOHANNSMEIER
BY Roland I. Griffin
ATTORNEY

PATENTED DEC 12 1972

3,705,769

5 Sheets-Sheet 5

INVENTOR
KARL-HEINZ JOHANNSMEIER
BY Roland I. Griffin
ATTORNEY

OPTICAL ALIGNMENT AND CONTACT PRINTING SYSTEM WITH IMPROVED CHUCK ASSEMBLY

BACKGROUND AND SUMMARY OF THE INVENTION

This invention relates generally to apparatus for aligning a semiconductor wafer and a photomask and transferring a geometric pattern on the mask to the wafer by contact printing. More particularly, this invention relates to improved chuck assemblies for use in such apparatus to position and maintain a photosensitive film bearing surface of the wafer in contact with a pattern bearing surface of the mask while the photosensitive film is exposed through the mask.

In many conventional optical alignment and contact printing systems the photosensitive film bearing surface of the wafer is driven into abutment upon the pattern bearing surface of the mask and so maintained during the contact printing operation by applying fluid pressure to the chuck assembly on which the wafer is supported and, in some cases, by additionally applying fluid pressure to the lower surface of the wafer itself. This type of pressure contact tends to bow the mask and thereby impair the alignment of the mask and wafer achieved during a previous pattern alignment operation. Moreover, if dust or other particles happen to be situated between the chuck assembly and the wafer supported thereon, the application of fluid drive pressure to the chuck assembly during the contact printing operation may also force the wafer against the mask with an uneven pressure across the mask. This impairs the resolution with which a pattern may be transferred from the mask to the wafer. The foregoing problems associated with conventional pressure contact chuck assemblies are especially serious in the case of large wafers having a diameter of 3 or more inches.

Some chuck assemblies have been developed for preventing mask bowing by permitting evacuation of the region between the chuck assembly and the mask, but they have typically not eliminated the problem of uneven contact pressure across the mask when dust or other particles happen to be situated between the chuck assembly and the wafer supported thereon. Furthermore, they have typically included structures fixedly projecting above the wafer bearing surface of the chuck assembly and thereby interfering with loading and unloading of the wafer in the plane of the wafer bearing surface of the chuck assembly. Such chuck assemblies require elaborate and expensive loading mechanisms typically incapable of properly loading wafers not previously carefully aligned for the loading mechanism by hand or another mechanism.

Accordingly, one of the principal objects of this invention is to provide an improved chuck assembly that may be used in an optical alignment and contact printing system to eliminate mask bowing during the contact printing operation without interfering with wafer loading and unloading in the plane of the wafer bearing surface of the chuck assembly during the wafer loading and unloading operation.

Another of the principal objects of this invention is to provide an improved chuck assembly for maintaining a wafer and a mask in abutment with uniform pressure across the mask even when dust or other particles happen to be situated between the wafer and the wafer bearing surface of the chuck assembly.

These objects are accomplished according to the preferred embodiments of this invention by employing a chuck assembly comprising a pivotally mounted chuck for applying a vacuum to the lower surface of a wafer to hold the wafer in place on the chuck and further comprising a piston for driving the chuck vertically upward under fluid pressure to position the upper surface of the wafer in abutment upon the lower surface of a mask supported above the chuck. According to one of the preferred embodiments, a first inflatable seal ring is fixedly mounted in an annular channel formed in the wafer bearing surface of the chuck around the wafer. This first seal ring is normally retracted from the wafer bearing surface of the chuck so as not to interfere with wafer loading and unloading in the plane of the wafer bearing surface of the chuck. However, when the upper surface of the wafer is positioned in abutment upon the lower surface of the mask in preparation for contact printing, the first seal ring is inflated to sealingly engage an unused marginal portion of the lower surface of the mask. The region enclosed between the mask, the first seal ring, and the chuck assembly is thereupon evacuated through a passageway communicating with the wafer bearing surface of the chuck between the first seal ring and the wafer. This clamps the chuck, the wafer, and the mask together thereby holding the mask and the wafer in intimate contact for contact printing and permitting removal of the fluid drive pressure applied to the chuck and, hence, equalization of the pressure applied to the chuck and the mask.

According to another of the preferred embodiments, a second inflatable seal ring similarly mounted within the first seal ring beneath a peripheral portion of the lower surface of the wafer and normally retracted from the wafer bearing surface of the chuck is also inflated to sealingly engage the lower surface of the wafer. In this case, the region enclosed between the mask, the first seal ring, the portion of the chuck between the first and second seal rings, the second seal ring, and the wafer is evacuated through a passageway communicating with the wafer bearing surface of the chuck between the first and second seal rings. This also clamps the chuck, the wafer, and the mask together thereby holding the mask and the wafer in intimate contact for contact printing and, in addition, permits removal of both the fluid drive pressure applied to the chuck and the vacuum applied to the lower surface of the wafer and, hence, equalization of the pressure applied directly to the wafer and the mask.

According to still others of the preferred embodiments, the first seal ring is fixedly mounted in an annular channel formed in a peripheral portion of the piston, is normally re-tracted from the plane of the wafer bearing surface of the chuck, and is employed either by itself or in combination with the second seal ring mounted in the chuck. In these cases, the chuck is pivotally mounted on an intermediate member coupled to the piston by a plurality of springs preventing relative movement between the intermediate member and the piston except by a limited amount along a common vertical axis and is provided with a third seal ring slidably engaging the piston to permit evacuation of the region enclosed between the mask and the chuck assembly by the first seal ring alone or in combination with the second seal ring.

Other and incidental objects of this invention will become apparent from a reading of this specification and an inspection of the accompanying drawings.

DESCRIPTION OF THE PREFERRED EMBODIMENTS

Figure 1:
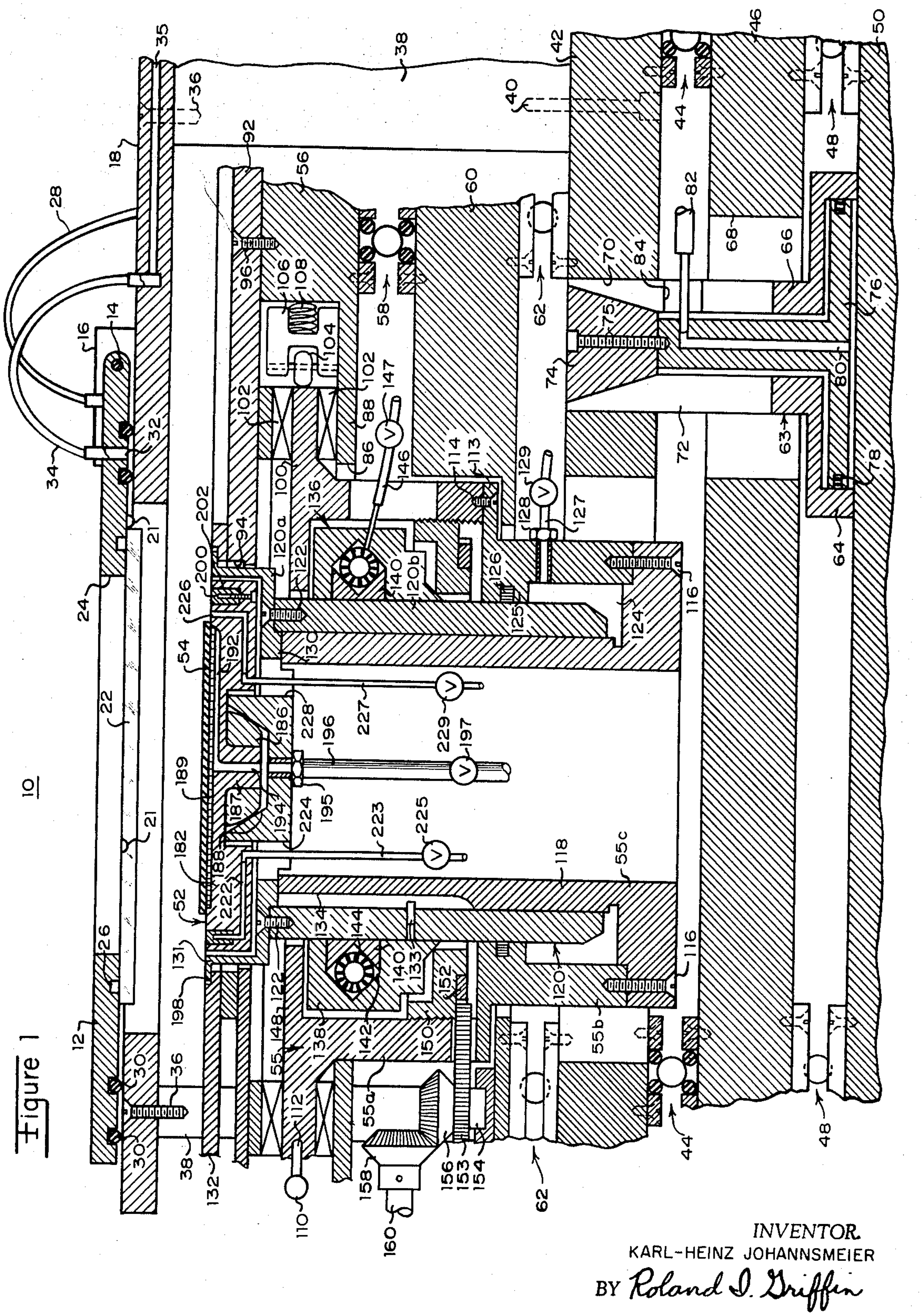
FIG. 1 is a half-sectional side view of an optical alignment and contact printing system according to one of the preferred embodiments of this invention when the chuck assembly is in the initial wafer loading and unloading position.
Figure 3:
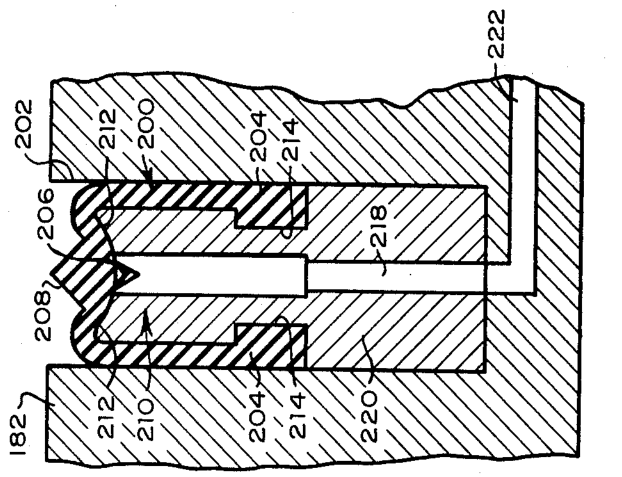

Referring to FIG. 1, there is shown an optical alignment and contact printing system 10 which, except as differently set forth herein, may be constructed and operated, for example, in the same manner as the system shown and described in detail in U. S. Pat. No. 3,490,846 entitled OPTICAL ALIGNMENT AND EXPOSURE APPARATUS, filed June 1, 1967, by Goetz H. Kasper, and issued Jan. 20, 1970. Optical alignment and contact printing system 10 includes a mask holder 12 pivotally mounted on a pin 14 extending between a pair of spaced blocks 16 secured to a top plate 18. Mask holder 12 may therefore be pivoted about the axis of pin 14 between a raised mask loading and unloading position and a lowered operative position when optical unit 20 (see FIG. 4) of the system is raised, as described in connection with FIG. 3 of U. S. Pat. No. 3,490,846.

Locating lugs 21 extend from the bottom of mask holder 12 for locating a photomask 22, which is made of glass or some other transparent material with a desired geometric pattern formed on its lower surface, at an aperture 24 extending through the mask holder. Mask 22 is held in place on mask holder 12 by drawing a vacuum through an annular groove 26 formed in the lower surface of mask holder 12 around aperture 24 and covered by the mask. This is accomplished by connecting groove 26 to a source of vacuum 27 (see FIG. 4) through a passageway in the mask holder, a flexible tube 28, a passageway in top plate 18, and a first normally open solenoid-operated valve. As shown and described in connection with FIG. 11 of U. S. Pat. No. 3,490,846, the first normally open solenoid-operated valve may be actuated to interrupt the vacuum connection to groove 26, thereby releasing mask 22 from mask holder 12, by a microswitch that is activated by the mask holder in the raised mask loading and unloading position.

A pair of concentric resilient seal rings 30 are mounted in grooves formed in the lower surface of mask holder 12 around groove 26. In the lowered operative position of mask holder 12, these seal rings sealingly engage the upper surface of top plate 18. Mask holder 12 may therefore be urged into tight engagement with top plate 18 by drawing a vacuum between seal rings 30. This is accomplished by connecting the region between seal rings 30 to the source of vacuum through a passageway 32 in the mask holder, a flexible tube 34, a passageway 35 in top plate 18, and a second normally open solenoid-operated valve. The second normally open solenoid-operated valve may be actuated to interrupt the vacuum connection between seal rings 30, thereby releasing mask holder 12 from top plate 18, by another microswitch that is activated when optical unit 20 (see FIG. 4) of the system is raised.

Top plate 18 on which mask holder 12 is mounted is attached by screws 36 to posts 38, which are in turn secured by screws 40 to a horizontally movable platform 42. This platform is horizontally reciprocally mounted by bearing supports 44 on an intermediate plate 46, which itself is horizontally reciprocally mounted by bearing supports 48 on a stationary base plate 50. Bearing supports 44 and 48 are oriented at right angles to one another so that platform 42 and intermediate plate 46 may be driven by a hand-operated lever arrangement, as described in connection with FIGS. 11 and 12 of U. S. Pat. No. 3,490,846, to move top plate 18 and, hence, mask holder 12 in any horizontal direction relative to stationary base plate 50.

Optical alignment and contact printing system 10 also includes a vacuum chuck 52 for supporting a semiconductor wafer 54 to be aligned with mask 22. Vacuum chuck 52 is positioned beneath mask holder 12 and is supported by a generally annular-shaped chuck holder 55 on another horizontally movable platform 56. This platform is horizontally reciprocally mounted by bearing supports 58 on another intermediate plate 60, which itself is horizontally reciprocally mounted by bearing supports 62 on platform 42. Bearing supports 58 and 62 are oriented at right angles to one another so that platform 56 and intermediate plate 60 may be driven by a hand-operated lever arrangement, as described in connection with FIGS. 11 and 13–14 of U. S. Pat. No. 3,490,846, to move chuck holder 55 and, hence, vacuum chuck 52 in any horizontal direction relative to platform 42 and mask holder 12 mounted thereon. This permits horizontal movement of wafer 54 relative to mask 22 to align a key pattern on the upper surface of the wafer with a corresponding key pattern on the lower surface of the mask.

Releasable locking apparatus 63, like that described in connection with FIG. 11 of U. S. Pat. No. 3,490,846, normally locks platform 42 against movement relative to stationary base plate 50 to facilitate alignment of the key pattern on the upper surface of wafer 54 with the corresponding key pattern on the lower surface of mask 22. This releasable locking apparatus comprises a cylinder 64 with an open bottom resting upon stationary base plate 50 and with a sleeve 66 extending upwardly through an enlarged clearance hole 68 in intermediate plate 46 and into a hole 70 in platform 42. Sleeve 66 is provided with longitudinally extending slots 72 so that it may be expanded outward into tight engagement with the walls of hole 70 by a sleeve expanding head 74 attached by a screw 75 to a piston 76 vertically reciprocally mounted within the cylinder. A peripheral seal ring 78 mounted in an annular lower portion of piston 76 provides slidable fluid-tight engagement between the cylinder and the piston. The region enclosed between the lower surface of piston 76 and the upper surface of stationary base plate 50 by cylinder 64 may therefore be evacuated to urge the cylinder into locking engagement with the stationary base plate and move the piston and attached head 74 downward thereby expanding sleeve 66 into locking engagement with platform 42. This is accomplished by connecting the enclosed region to the source of vacuum through a passageway 80 in the piston, a flexible tube 82 extending through an opening 84 in sleeve 66 of the cylinder, and a third normally open control valve. As explained in connection with FIG. 11 of U. S. Pat. No. 3,490,846, the third normally open control valve may be actuated to vent tube 82 to the atmosphere and thereby release cylinder 64 from locking engagement with stationary base plate 50 and platform 42. This permits movement of mask holder 12 and vacuum chuck 52 together as a unit relative to stationary base plate 50 so that mask 22 and wafer 54 may be brought into the optical field of a microscope of optical unit 20 (see FIG. 4) without moving the ocular lens system 85 of the microscope.

In order to further facilitate alignment of the key pattern on the upper surface of wafer 54 with the corresponding key pattern on the lower surface of mask 22, vacuum chuck 52 is also made horizontally adjustable in a rotary direction about its vertical axis. This is accomplished in the same manner as described in connection with FIGS. 11 and 15 of U. S. Pat. No. 3,490,846 by providing platform 56 with an aperture 86 for receiving chuck holder 55 and with a radial flange 88 positioned at the lower end of this aperture for rotatably supporting the chuck holder. A plate 92 with an aperture 94 positioned in axial alignment with aperture 86 is secured to the top of platform 56 by screws 96. Plate 92 and flange 88 form an annular channel within which an outwardly directed radial flange 100 of chuck holder 55 is supported between thrust bearings 102 to rotatably support the chuck holder on platform 56. Chuck holder 55 is maintained in axial alignment with aperture 86 by three roller bearings mounted on platform 56 at spaced positions around radial flange 88. One of these roller bearings 104 is carried by a radially slidable block 106 that is resiliently biased by a spring 108 toward chuck holder 55 to urge roller bearing 104 into engagement with the chuck holder which, in turn, is urged into engagement with the other two roller bearings. A ball 110 is carried at the end of a pin 112 extending from flange 100 of chuck holder 55 so that fine and coarse rotatable adjustment of the chuck holder and, hence, vacuum chuck 52 may be accomplished by engagement of ball 110 between a pair of operator-controlled adjustably positionable push rods in the same manner as described in connection with FIG. 15 of U. S. Pat. No. 3,490,846.

Figure 4:
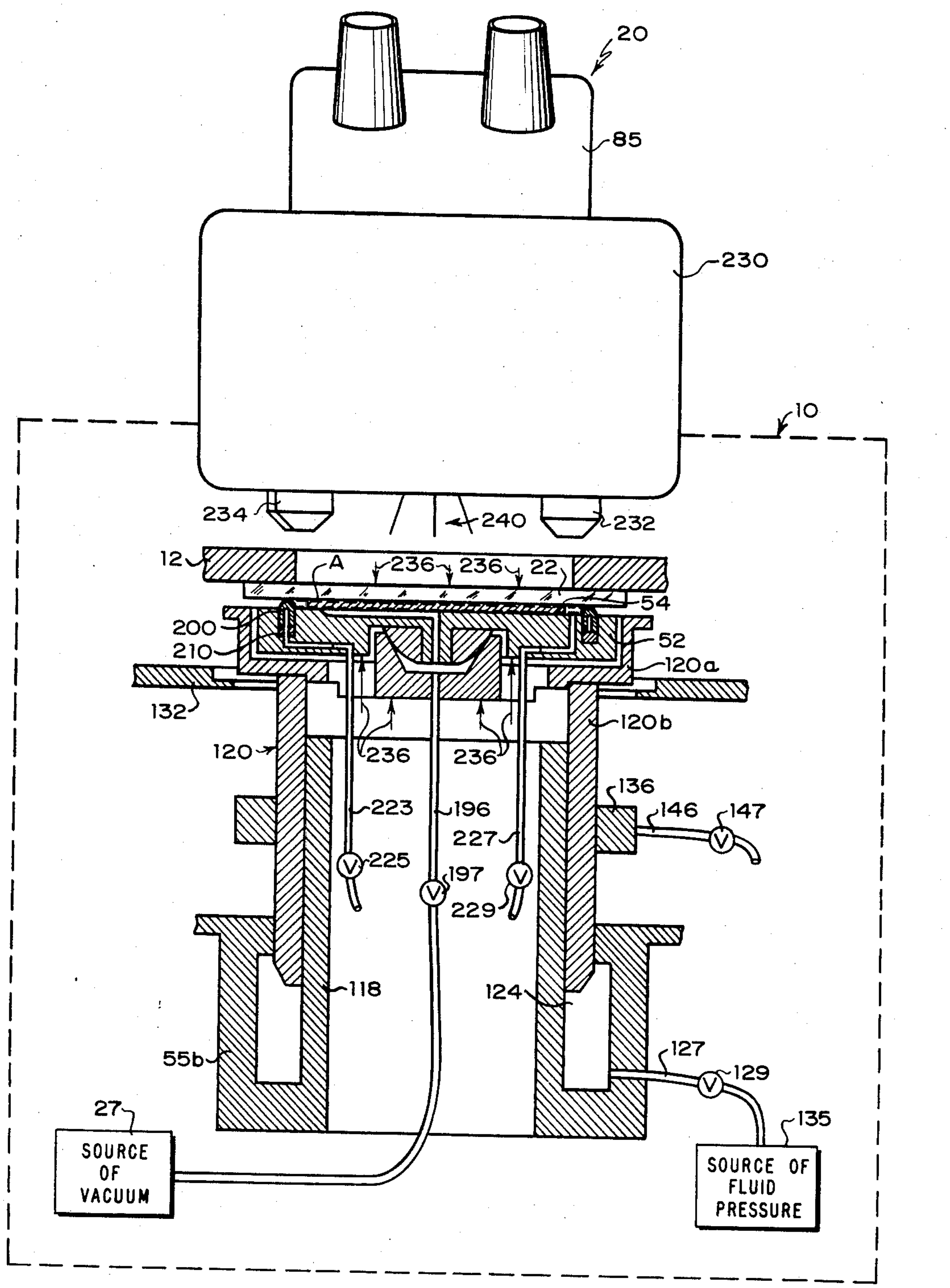
FIG. 4 is a simplified representation of the optical alignment and contact printing system of FIG. 1, as viewed in a plane orthogonal to that of FIG. 1, when the chuck assembly is in the contact printing position.

Chuck holder 55 comprises an annular upper part **55*a* with radial flange 100, an annular intermediate part 55*b* with an outwardly directed radial flange 113 positioned at its upper end and secured to upper part 55*a* by screws 114, and an annular lower part 55*c* attached to intermediate part 55*b* by screws 116. Lower part 55*c* has a cylindrical wall 118 that extends upward through intermediate and upper parts 55*b* and 55*a* at a spaced distance therefrom. A piston 120 for supporting vacuum chuck 52 and moving it between a lowered wafer loading and unloading position shown in FIG. 1 and a raised parallel plane alignment and contact printing position shown in FIG. 4 is vertically reciprocally supported at the upper end of cylindrical wall 118. This piston comprises a hollow cylindrical part 120*a* for receiving and coaxially supporting vacuum chuck 52 at the upper end of cylindrical wall 118. It also comprises a sleeve-like part 120*b* telescopically surrounding cylindrical wall 118 and coaxially secured to cylindrical piston part 120*a* by screws 122. The lower portion of sleeve-like piston part 120*b* is received within an annular chamber 124 formed between intermediate and lower parts 55*b* and 55*c* of the chuck holder by an inwardly directed radial flange 125 positioned at the upper end of intermediate part 55*b*. A peripheral seal ring 126 mounted in flange 125 provides slidable fluid-tight engagement between sleeve-like piston part 120*b* and the mouth of chamber 124**.

Piston 120 and, hence, vacuum chuck 52 are raised toward mask holder 12 by applying fluid pressure to chamber 124 through a flexible tube 127 and a fitting 128 extending through intermediate part **55*b* of the chuck holder. This is accomplished by actuating a fourth control valve 129 to connect tube 127 and, therefore, chamber 124 to a source of fluid pressure 135 (see FIG. 4) such as compressed air or nitrogen. Piston 120 and vacuum chuck 52 are lowered under the action of gravity by actuating the fourth control valve 129 to disconnect tube 127 from the source of fluid pressure and vent it instead to the atmosphere thereby interrupting the fluid pressure connection to chamber 124. The fourth control valve may also be actuated to connect tube 127 to the source of vacuum and thereby facilitate the lowering of piston 120 and vacuum chuck 52. An annular portion 130 of piston part 120*a* abuts upon the upper end of cylindrical wall 118 to prevent piston 120 and vacuum chuck 52 from travelling downward beyond the lowered wafer loading and unloading position at which the upper surface of the vacuum chuck and the upper surface of the piston (i.e. the upper surface of peripheral portion 131 of piston part 120*a*) lie in the same plane as the upper surface of a top plate 132. A pin 133 also extends through one side of sleeve-like piston part 120*b* and protrudes into an adjoining longitudinally extending groove 134 in cylindrical wall 118 of the chuck holder to prevent rotation of piston 120 and vacuum chuck 52** relative to the chuck holder as the piston and vacuum chuck are raised and lowered.

Piston 120 is surrounded by a locking device 136, like that described in connection with FIG. 16 of U. S. Pat. No. 3,490,846, for being raised a finite distance with the piston and for thereafter being releasably secured to the piston. Locking device 136 comprises a locking ring 138 coaxially positioned around sleeve-like piston part 120*b*, two or more locking ring sections 140 coaxially positioned around sleeve-like piston part 120*b* and within an annular groove 142 in the inner wall of locking ring 138, and a resilient inflatable tube 144 seated within groove 142 between a V-shaped bottom surface thereof and a V-shaped groove formed in the outer wall of locking ring sections 140. Locking device 136 is locked to piston 120 by inflating tube 144 and thereby urging locking ring sections 140 radially inward into clamping engagement with sleeve-like piston part 120*b*. Tube 144 is inflated by applying fluid pressure thereto through a flexible tube 146 passing through an aperture in locking ring 138 of the locking device. This is accomplished by actuating a fifth control valve 147 to connect tube 146 and, therefore, inflatable tube 144 to the source of fluid pressure. Locking ring 138 may be released from locking engagement with piston 120 by actuating the fifth control valve 147 to disconnect tube 146 from the source of fluid pressure and vent it instead to the atmosphere thereby deflating tube 144 and permitting vertical sliding movement of locking device 136 relative to the piston. Sufficient frictional engagement is provided between locking ring sections 140 of locking device 136 and sleeve-like part 120*b* of the piston by tube 144 when deflated to permit upward vertical travel of the locking device with the piston and to prevent the locking device from sliding downwardly along the piston under the force of gravity.

Upward vertical movement of locking device 136 is limited by a first stop comprising an inwardly directed radial flange 148 of upper part 55*a* of the chuck holder. Similarly, downward vertical movement of the locking device is limited by an adjustable second stop comprising an externally-threaded stop ring 150 screwed into an internally-threaded lower portion of upper part 55*a*. A ring gear 152 is attached to an inwardly offset lower portion of stop ring 150 and engaged by a spur gear 153 affixed to a rotatably mounted shaft 154. Shaft 154 is coupled through bevel gears 156 and 158 to another shaft 160 that extends out the front of the instrument. Thus, by turning shaft 160 the operator may adjust the vertical separation between stop ring 150 and flange 148 of the chuck holder.

As described in connection with FIG. 16 of U. S. Pat. No. 3,490,846, vacuum chuck 52 includes a circular chuck plate 182 with a central downwardly-extending stem 187 secured to a bearing member 186, which is in the form of a section of a sphere. Bearing member 186 is seated in a central conically-recessed portion 188 of cylindrical piston part 120a so that the center of radius of bearing member 186 is located at substantially the center of a perforated circular top plate 189 concentrically mounted on a central recessed portion of the upper surface of chuck plate 182, so that clearance space is provided between chuck plate 182 and the rest of cylindrical piston part 120*a*, and so that the upper surface of chuck plate 182 and perforated top plate 189 lies in substantially the same plane as the upper surface of peripheral portion 131 of cylindrical piston part 120*a*. Vacuum chuck 52 may therefore pivot about its vertical axis in any horizontal direction as required for parallel plane alignment of the adjacent surfaces of wafer 54 and mask 22.

Perforated top plate 189 covers a plurality of interconnected radial grooves 192 formed in the central recessed portion of the upper surface of chuck plate 182. These grooves communicate with an axial bore 194 longitudinally extending through stem 187 of the chuck plate. Axial bore 194 in turn communicates with a fitting 195 axially extending through the central conically-recessed portion 188 of cylindrical piston part 120*a* and communicating with a flexible tube 196. Wafer 54 is positioned on the upper surface of vacuum chuck 52 over perforated top plate 189 and may therefore be firmly held in place on the vacuum chuck by drawing a vacuum through perforated top plate 189, radial grooves 192, axial bore 194, fitting 195, and tube 196. This vacuum is drawn by actuating a sixth control valve 197 to connect tube 196 to the source of vacuum. The vacuum drawn through tube 196 also increases the frictional engagement between bearing member 186 and the central conically-recessed portion 188 of cylindrical piston part 120*a*. This frictional engagement is sufficient to maintain vacuum chuck 52 in whatever position it may be pivoted to during parallel plane alignment of the adjacent surfaces of wafer 54 and mask 22 and to clamp vacuum chuck 52 and piston 120 together.

When a wafer 54 is to be loaded onto or unloaded from vacuum chuck 52, the sixth control valve 197 is actuated to disconnect tube 196 from the source of vacuum and vent it instead to the atmosphere thereby permitting sliding movement of the wafer across the upper surface of the vacuum chuck. A wafer 54 may then be loaded onto and unloaded from vacuum chuck 52 by simply moving the wafer along the upper surface of top plate 132 and the adjoining upper surfaces of the vacuum chuck and peripheral portion 131 of piston 120 when the vacuum chuck is in the lowered wafer loading and unloading position. This may be accomplished by employing a wafer loading and unloading mechanism like that described in connection with FIGS. 17–23 of U. S. Pat. No. 3,490,846 or that shown and described in my copending U.S. Pat. application Ser. No. 88,726 entitled WAFER LOADING APPARATUS and filed on Nov. 12, 1970. The wafer loading and unloading mechanism is rendered operative by a microswitch activated for this purpose by a peripheral flange 198 of cylindrical piston part 120*a* when the vacuum chuck is lowered to the wafer loading and unloading position and is rendered inoperative once the vacuum chuck is raised from the wafer loading and unloading position.

Figure 2:
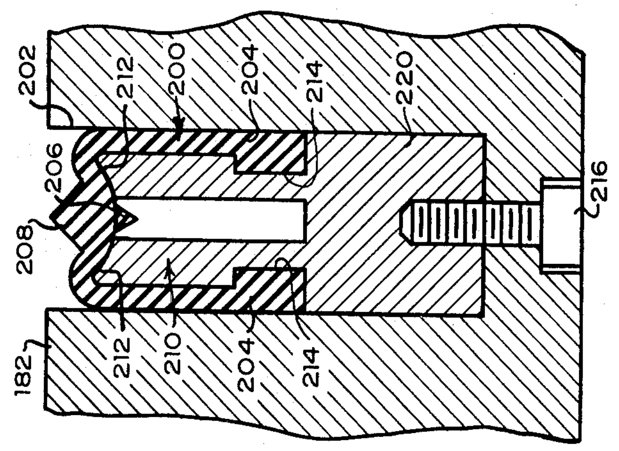
FIGS. 2 and 3 are cross-sectional views of one of the inflatable seal rings employed in the chuck assembly of FIG. 1.

According to one of the preferred embodiments of this invention, a first inflatable seal ring 200 is fixedly mounted in an annular channel 202 formed in the wafer bearing upper surface of chuck plate 182 around perforated top plate 189 and wafer 54 supported thereon. As shown in detail in FIGS. 2 and 3, inflatable seal ring 200 comprises an inverted generally U-shaped rubber annulus with a pair of oppositely facing shoulders 204 around its lower inner edges and with an inwardly curved upper end having a triangular inner ridge 206 and a larger triangular outer ridge 208. Seal ring 200 is held in fluid-tight engagement with the walls of channel 202 of the chuck plate by a generally U-shaped annular retainer 210. This retainer is provided with a pair of oppositely facing channels 214 around the outer walls thereof for receiving and snugly engaging shoulders 204 of the seal ring and is further provided with inwardly curved upper edges 212 for supporting the inwardly curved upper end of seal ring 200 when the seal ring is deflated. It is secured to the bottom of channel 202 by a plurality of symmetrically spaced screws 216 (see FIG. 2), and is additionally provided with a passageway 218 extending through the lower end 220 thereof and communicating with another passageway 222 extending through the lower portion of chuck plate 182 (see FIG. 3).

The first seal ring 200 is normally deflated and retracted from the wafer bearing upper surface of chuck plate 182 so as not to interfere with wafer loading and unloading in the plane of this wafer bearing surface when vacuum chuck 52 is in the lowered wafer loading and unloading position. However, it may be inflated to project above the upper surface of wafer 54 and to sealingly engage an unused marginal portion of the lower surface of mask 22 when vacuum chuck 52 is in the raised contact printing position. The first seal ring 200 is inflated by applying fluid pressure to the interior of seal ring retainer 210 through passageway 218 in the lower end of seal ring retainer 210, passageway 222 in chuck plate 182, and a flexible tube 223 passing through a circular aperture 224 in cylindrical piston part **120*a*. This is accomplished by actuating a seventh control valve 225 to connect tube 223** to the source of fluid pressure.

A passageway 226 extends through chuck plate 182 and communicates with the upper surface of the chuck plate between the first seal ring 200 and both the perforated top plate 189 and the wafer 54 supported thereon. This passageway is connected to a flexible tube 227 passing through another circular aperture 228 symmetrically positioned in cylindrical piston part **120*a* opposite circular aperture 224. Thus, when the first seal ring 200 is inflated to sealingly engage the lower surface of mask 22, the region enclosed between the lower surface of the mask and the upper surface of the vacuum chuck by the first seal ring may be evacuated through passageway 226 and tube 227 to clamp the vacuum chuck and the wafer to the mask. This is accomplished by actuating an eighth control valve 229 to connect tube 227** to the source of vacuum.

vacuum chuck 52 and wafer 54 may be unclamped from mask 22 by breaking the seal between the first seal ring 200 and the mask and by deflating the first seal ring and returning it to its normal retracted position. This is accomplished by actuating the seventh and eighth control valves 225 and 229 to disconnect tubes 223 and 227 from the sources of fluid pressure and vacuum, respectively, and vent them instead to the atmosphere. The seventh control valve 225 may also be actuated to actuated to connect tube 223 to the source of vacuum and thereby facilitate breaking the seal between the first seal ring and the mask and returning the first seal ring to its normal retracted position.

In the operation of optical alignment and contact printing system 10, a mask 22 is loaded onto mask holder 12 while optical unit 20 (see FIG. 4) of the system is raised and the mask holder is in its raised mask loading and unloading position. The mask is firmly held in place on mask holder 12 by drawing a vacuum through the first normally open solenoid-operated valve and, hence, groove 26. Mask holder 12 and optical unit 20 are then both pivoted to their lowered operative positions. The mask holder is firmly held in its lowered operative position upon top plate 18 by drawing a vacuum through the second normally open solenoid-operated valve and, hence, the region between seal rings 30. Either before or after this mask loading operation, a wafer 54 is loaded onto vacuum chuck 52 while the vacuum chuck is in its lowered wafer loading and unloading position. The wafer is firmly held in place on vacuum chuck 52 by actuating the sixth control valve 197 to connect tube 196 to the source of vacuum, thereby applying a vacuum to the lower surface of the wafer through perforated top plate 189.

Following these mask and wafer loading operations, piston 120 and, hence, vacuum chuck 52 are driven upward toward mask holder 12 by actuating the fourth control valve 129 to connect tube 127 to the source of fluid pressure thereby applying fluid pressure to chamber 124 and, hence, to the piston. This positions the upper surface of wafer 54 in abutment upon the lower surface of mask 22 and thereby pivots vacuum chuck 52 as required to establish parallel plane alignment of these adjacent surfaces. It also positions locking device 136, which frictionally engages piston 120 as described above, in abutment upon flange 148 of chuck holder 55. Locking device 136 is then locked to piston 120 by actuating the fifth control valve 147 to connect tube 146 to the source of fluid pressure thereby inflating tube 144 and urging locking ring sections 140 of the locking device into clamping engagement with the piston. Piston 120 and, hence, vacuum chuck 52 are then lowered to an intermediate pattern alignment position between the raised parallel plane alignment and the lowered wafer loading and unloading positions by actuating the fourth control valve 129 to disconnect tube 127 from the source of fluid pressure and vent it instead to the atmosphere or connect it to the source of vacuum. Downward movement of piston 120 and vacuum chuck 52 to the intermediate pattern alignment position is stopped by abutment of locking device 136 upon adjustable stop ring 150.

Since locking device 136 is clamped to piston 120 only after being raised into abutment upon flange 148 of the chuck holder and only after wafer 54 is raised into abutment upon mask 22, the separation achieved between the upper surface of the wafer and the lower surface of the mask by downward movement of the piston and vacuum chuck to the intermediate pattern alignment position is the same for wafers of different thickness. Although the setting of adjustable stop ring 150 may be altered to adjust the separation achieved between the upper surface of wafer 54 and the lower surface of mask 22 by downward movement of the piston and vacuum chuck to the intermediate pattern alignment position, the adjustable stop ring is typically set to provide a separation of, for example, 0.0002 to 0.002 of an inch and is not thereafter changed from wafer to wafer.

Once piston 120 and vacuum chuck 52 are lowered to the intermediate pattern alignment position, a key pattern on the upper surface of wafer 54 may be aligned with a corresponding key pattern on the adjacent parallel lower surface of mask 22. This is accomplished with the aid of optical unit 20 (see FIG. 4), which may be of the same type as that described in detail in connection with FIGS. 1–10 of U. S. Pat. No. 3,490,846, by rotating a turret 230 of the optical unit to position a single field row and column or a split-field objective lens system 232 or 234, respectively, in operative alignment with stationary ocular lens system 85 of the microscope, and by then horizontally moving vacuum chuck 52 relative to mask holder 12 while viewing the orientation of the key patterns on mask 22 and wafer 54 through the aligned ocular and objective lens systems of the microscope.

After these parallel plane and pattern alignment operations, piston 120 and vacuum chuck 52 are returned to the raised position by once again actuating the fourth control valve 129 to connect tube 127 and, hence, chamber 124 to the source of fluid pressure. This again positions the upper surface of wafer 54 in abutment upon the lower surface of mask 22 in preparation for contact printing. As shown in FIG. 4, the first seal ring 200 is then inflated to sealingly engage an unused marginal portion of the lower surface of mask 22 by actuating the seventh control valve 225 to connect tube 223 to the source of fluid pressure 135 thereby applying fluid pressure to the interior of seal ring retainer 210 and, hence, to the first seal ring itself. The region enclosed (as indicated by dashed line A) between mask 22, the first seal ring 200, and vacuum chuck 52 is thereupon evacuated by actuating the eighth control valve 229 to connect tube 227 and, hence, the enclosed region to the source of vacuum 27. This clamps vacuum chuck 52, wafer 54 supported thereon, and mask 22 together thereby holding the mask and the wafer in intimate contact for contact printing. If desired, the fourth control valve 129 may thereupon be actuated to disconnect tube 127 and, hence, chamber 124 from the source of fluid pressure 135 and vent them instead to the atmosphere. This removes the fluid drive pressure from piston 120 and vacuum chuck 52 thereby equalizing the pressure applied to mask 22 and wafer 54 as indicated by arrows 236 (these arrows represent atmospheric pressure). Even when the fluid drive pressure is removed from piston 120 and vacuum chuck 52, they both remain in the raised contact printing position with the vacuum chuck clamped to the mask and the piston clamped to the vacuum chuck as long as fluid pressure continues to be applied through tube 223 and vacuum continues to be drawn through tubes 227 and 196. In any case, once wafer 54 and mask 22 are clamped together, contact printing is achieved by rotating turret 230 of optical unit 20 to position a mirror for directing a beam of ultraviolet light 240 onto the mask and to thereby expose a photosensitive film on the upper surface of the wafer through a pattern on the lower surface of the mask.

Following this contact printing operation, vacuum chuck 52 and wafer 54 supported thereon are unclamped from mask 22 by actuating the seventh and eighth control valves 225 and 229 to disconnect tubes 223 and 227 from the sources of fluid pressure and vacuum 135 and 27, respectively, and vent them instead to the atmosphere. Locking device 136 is then unclamped from piston 120 by actuating the fifth control valve 147 to disconnect tube 146 from the source of fluid pressure 135 and vent it instead to the atmosphere. Piston 120 and vacuum chuck 52 are thereupon returned to the lowered wafer loading and unloading position by similarly actuating the fourth control valve 129 to disconnect tube 127 from the source of fluid pressure 135 and vent it to the atmosphere, if this has not already been done, or connect it to the source of vacuum 27. Once vacuum chuck 52 is returned to its lowered wafer loading and unloading position, the vacuum applied to the lower surface of wafer 54 is removed by actuating the sixth control valve 197 to disconnect tube 196 from the source of vacuum 27 and vent it instead to the atmosphere. Wafer 54 may then be unloaded from vacuum chuck 52 and replaced by the next wafer to be aligned with and exposed through mask 22.

Figure 5:
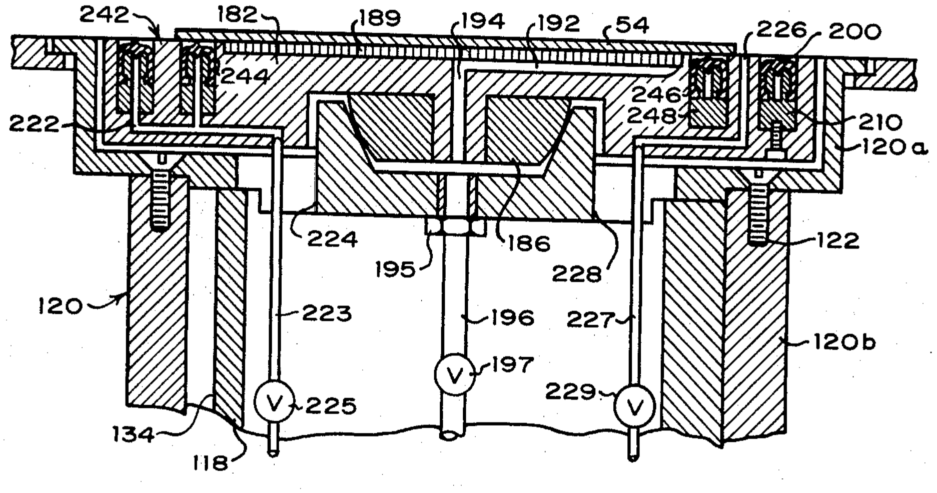
FIG. 5 is a half-sectional side view of a chuck assembly according to another of the preferred embodiments of this invention when it is in the initial wafer loading and unloading position.

Referring to FIG. 5, there is shown a vacuum chuck 242 according to another of the preferred embodiments of this invention. Vacuum chuck 242 may be employed in optical alignment and contact printing system 10 of FIG. 1 in place of vacuum chuck 52. It includes all the parts of vacuum chuck 52. These parts have already been described above with the aid of FIGS. 1–3 and are therefore represented in FIG. 5 by the same reference numerals used for them in FIGS. 1–3. In addition, vacuum chuck 242 includes a second inflatable seal ring 244 fixedly mounted in an annular channel 246 formed in the wafer bearing upper surface of chuck plate 182 around perforated top plate 189 and beneath a peripheral portion of the lower surface of wafer 54. The second inflatable seal ring 244 is of the same type and held in place by a retainer 248 in the same manner as the first inflatable seal ring 200. It is also normally deflated and retracted from the wafer bearing upper surface of chuck plate 182, like the first inflatable seal ring 200, so as not to interfere with wafer loading and unloading in the plane of this wafer bearing surface when the vacuum chuck is in the lowered wafer loading and unloading position.

Figure 6:
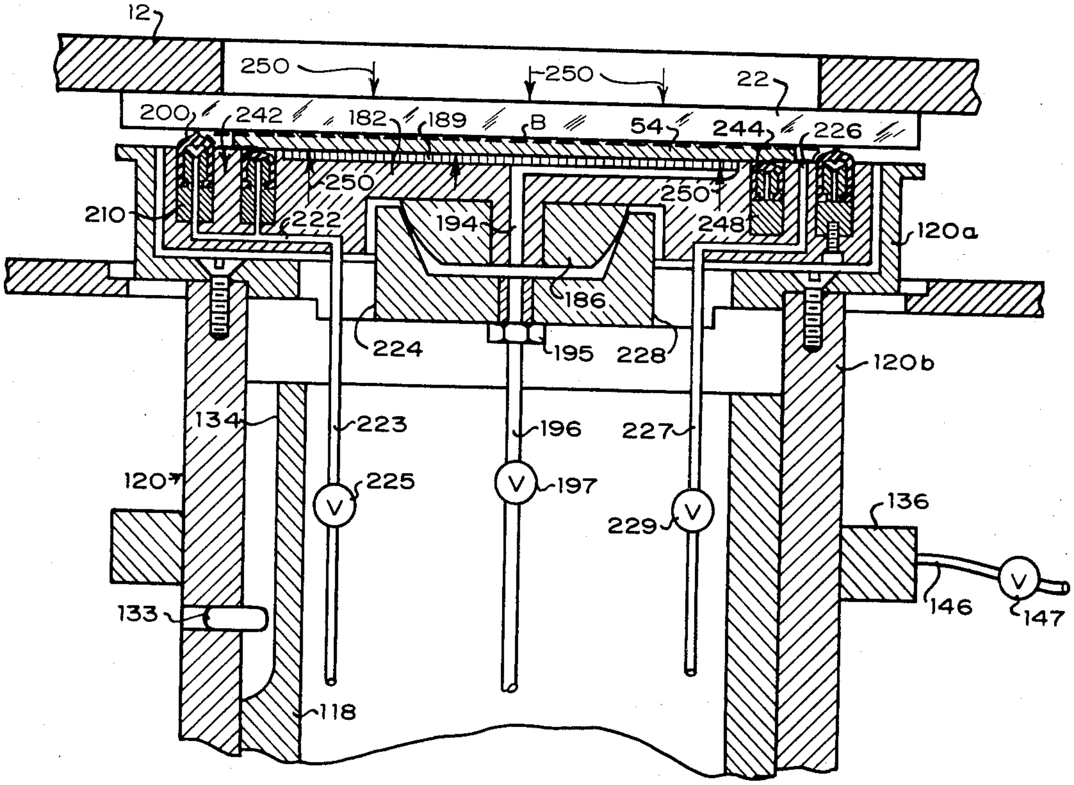
FIG. 6 is a simplified representation of the chuck assembly of FIG. 5 when it is in the contact printing position.

As shown in FIG. 6, when vacuum chuck 242 is driven upward to the raised position by piston 120 in preparation for contact printing, the first and second seal rings 200 and 244 are inflated to sealingly engage an unused marginal portion of the lower surface of mask 22 and a concentric peripheral portion of the lower surface of wafer 54, respectively. The first and second seal rings 200 and 244 are inflated by applying fluid pressure through a modified passageway 222 extending through the lower portion of chuck plate 182 and communicating with the interiors of both the first and second seal ring retainers 210 and 248 and with flexible tube 223. This is accomplished by actuating the seventh control valve 225 to connect tube 223 to the source of fluid pressure. The region enclosed (as indicated by dashed line B) between mask 22, the first seal ring 200, the portion of vacuum chuck 242 between the first and second seal rings 200 and 244, the second seal ring 244, and wafer 54 is thereupon evacuated. This is accomplished by actuating the eighth control valve 229 to connect tube 227 and, hence, passageway 226, which communicates with the upper surface of chuck plate 182 between the first and second seal rings 200 and 244 and between the first seal ring 200 and both perforated top plate 189 and wafer 54, to the source of vacuum. Evacuation of the enclosed region B clamps vacuum chuck 242, wafer 54, and mask 22 together thereby holding the mask and the wafer in intimate contact for contact printing. If desired, the fourth and sixth control valves 129 and 197 may then be actuated to disconnect tubes 127 and 196 from the sources of fluid pressure and vacuum, respectively, and vent them instead to the atmosphere thereby removing both the fluid drive pressure applied to piston 120 and, hence, vacuum chuck 242 and the vacuum applied to the lower surface of wafer 54. This equalizes the pressure applied to the upper surface of mask 22 and the lower surface of wafer 54 as indicated by arrows 250 (representing atmospheric pressure) and prevents dust or other particles that may be situated on the wafer bearing upper surface of vacuum chuck 242 from causing uneven contact pressure between these adjacent surfaces of the wafer and the mask. When both the fluid drive pressure applied to piston 120 and the vacuum applied to the lower surface of wafer 54 are removed, the piston travels downward until locking device 136, which is clamped to the piston by application of fluid pressure to tube 146, abuts upon adjustable stop ring 150. However, vacuum chuck 242 remains clamped to mask 22 in the raised contact printing position as long as fluid pressure continues to be applied through tube 223 and vacuum continues to be drawn through tube 227.

Once the contact printing operation is finished, piston 120 is driven upward into supporting engagement with vacuum chuck 242 by actuating the fourth control valve 129 to connect tube 127 to the source of fluid pressure. Concomitantly, vacuum is again applied to the lower surface of wafer 54 by actuating the sixth control valve 197 to connect tube 196 to the source of vacuum. Vacuum chuck 242 and wafer 54 supported thereon are then unclamped from mask 22 by actuating the seventh and eighth control valves 225 and 229 to disconnect tubes 223 and 227 from the sources of fluid pressure and vacuum, respectively, and vent them instead to the atmosphere. Locking device 136 is thereupon unclamped from piston 120 by actuating the fifth control valve 147 to disconnect tube 146 from the source of fluid pressure and vent it instead to the atmosphere. Vacuum chuck 242 is then returned to its initial wafer loading and unloading position by similarly actuating the fourth control valve 129 to once again disconnect tube 127 from the source of fluid pressure and vent it to the atmosphere or connect it to the source of vacuum.

The separation achieved between vacuum chuck 242 and piston 120 when tubes 127 and 196 are vented to the atmosphere to equalize the pressure applied to the upper surface of mask 22 and the lower surface of wafer 54 is normally limited to only 0.002 or less of an inch by abutment of locking device 136, which is then clamped to the piston, upon adjustable locking ring 150. Thus, once the contact printing operation is finished and vacuum is again applied to the lower surface of wafer 54, vacuum chuck 242 may simply be unclamped from mask 22 and permitted to drop back into engagement with piston 120 in lieu of driving the piston upward into engagement with the vacuum chuck. Vacuum chuck 242 may then be returned to the lowered wafer loading and unloading position by unclamping locking device 136 from piston 120 and venting tube 127 to the atmosphere or drawing a vacuum therethrough.

Vacuum chuck 242 may be modified so that each of the first and second seal rings 200 and 244 is inflated by application of fluid pressure from the source of fluid pressure through a separate control valve, a separate flexible tube 223 passing through one of the apertures 224 or 228 in cylindrical piston part 120*a*, and a separate passageway 222 extending through the lower portion of chuck plate 182 and communicating with the interior of the corresponding seal ring retainer 210 or 246. When so modified, vacuum chuck 242 may also be operated in the same manner as vacuum chuck 52 if the operator so desires.

Figure 7:
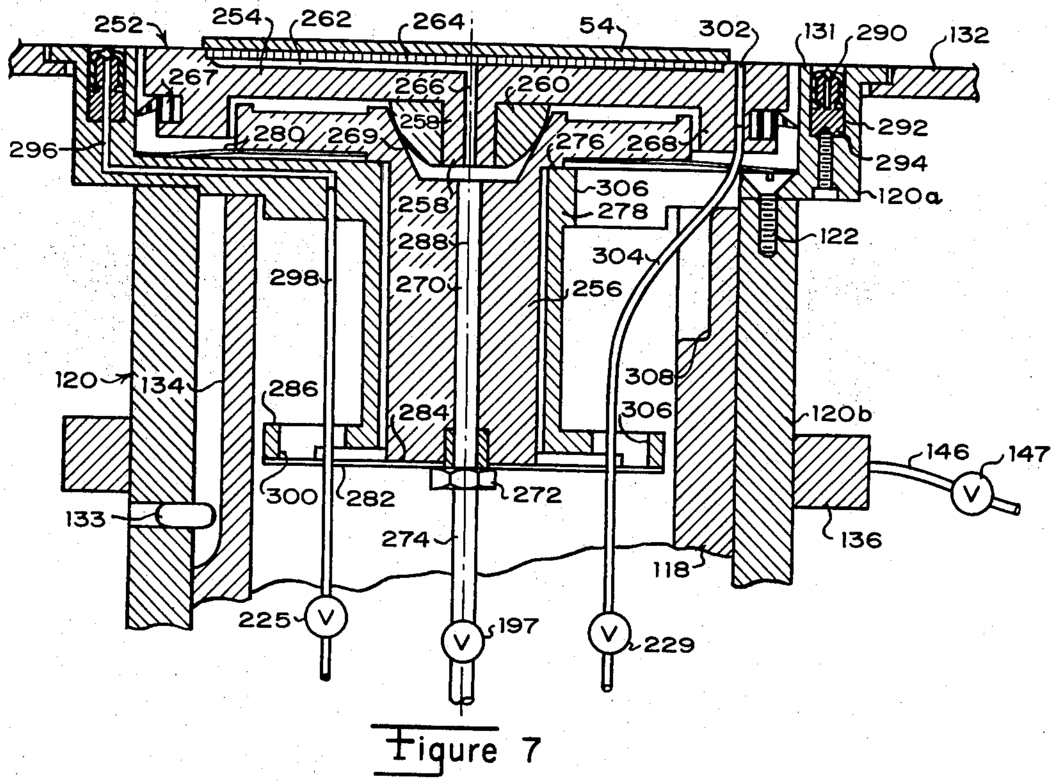
FIGS. 7 and 8 are half-sectional side views of chuck assemblies according to still others of the preferred embodiments of this invention.

Referring to FIG. 7, there is shown a vacuum chuck 252 according to still another of the preferred embodiments of this invention. Vacuum chuck 252 may also be employed in optical alignment and contact printing system 10 of FIG. 1 in place of vacuum chuck 52. It includes a circular chuck plate 254 coaxially supported by a cylindrical part 256 which is in turn coaxially supported within a modified cylindrical piston part 120*a*. Chuck plate 254 is provided with a central downwardly extending stem 258 secured to a bearing member 260, with a plurality of interconnected radial grooves 262 formed in the upper surface of the chuck plate and covered by a concentric perforated circular top plate 264, with an axial bore 266 longitudinally extending through stem 258 and communicating with radial grooves 262, and with a seal ring 267 fixedly mounted around peripheral portion 268 of the chuck plate and in slidable fluid-tight engagement with the inner wall of peripheral portion 131 of modified piston part 120*a*.

Bearing member 260 comprises a section of a sphere seated in a central conically-recessed portion 269 of cylindrical part 256 so that the center of radius of the bearing member is located at the center of perforated top plate 264, so that clearance space is provided between chuck plate 254 and the rest of cylindrical part 256 and between chuck plate 254 and modified piston part 120*a*, and so that the upper surface of vacuum chuck 252 lies in substantially the same plane as the upper surface of peripheral portion 131 of modified piston part 120*a* and the upper surface of top plate 132 when vacuum chuck 252 is in the lowered wafer loading and unloading position. This permits vacuum chuck 252 to pivot about its vertical axis in any horizontal direction as required for parallel plane alignment and facilitates loading and unloading wafer 54.

Once loaded onto vacuum chuck 252, wafer 54 is held in place thereon by drawing a vacuum through perforated top plate 264, radial grooves 262 and axial bore 266 in chuck plate 254, an axial bore 270 extending through cylindrical part 256, a fitting 272, and a flexible tube 274. This is accomplished by actuating the sixth control valve 197 to connect tube 274 to the source of vacuum. The vacuum drawn through tube 274 also increases the frictional engagement between bearing member 260 and the central conically-recessed portion 269 of cylindrical part 256. This frictional engagement is sufficient to maintain vacuum chuck 252 in whatever position it may be pivoted to during parallel plane alignment of the adjacent surfaces of wafer 54 and mask 22 and to clamp vacuum chuck 252 and cylindrical part 256 together.

Cylindrical part 256 and, hence, vacuum chuck 252 are supported upon piston 120 by abutment of an annular upper portion 276 of cylindrical part 256 upon an upper portion 278 of modified piston part 120*a*. In addition, cylindrical part 256 is mechanically coupled to piston 120 by a plurality of flat springs 280 symmetrically attached between upper portion 276 of cylindrical part 256 and upper portion 278 of modified piston part 120a and by a plurality of flat springs 282 symmetrically attached between the lower end 284 of cylindrical part 256 and an annular lower portion 286 of modified piston part 120*a*. Flat springs 280 and 282 prevent relative movement between cylindrical part 256 and modified piston part 120*a* except by a limited amount of about 0.002 or less of an inch along a common vertical axis 288.

A first inflatable seal ring 290 of the same type as seal rings 200 and 244 described above in connection with FIGS. 1–6 is fixedly mounted in an annular channel 292 formed in peripheral portion 131 of modified piston part 120*a* around chuck plate 254. The first inflatable seal ring 290 is held in place by a retainer 294 in the same manner as described above in connection with inflatable seal rings 200 and 244 and is also normally deflated and retracted from the plane of the wafer bearing upper surface of vacuum chuck 252 so as not to interfere with wafer loading and unloading in the plane of this wafer bearing surface.

When vacuum chuck 252 is driven upward to the raised parallel plane alignment and contact printing position by piston 120 in preparation for contact printing, the first seal ring 290 is inflated to sealingly engage an unused marginal portion of mask 22. Seal ring 290 is inflated by applying fluid pressure to the interior of seal ring retainer 294 through a passageway 296 extending through the upper portion 278 of modified piston part 120*a* and communicating with the interior of seal ring retainer 294 and with a flexible tube 298 passing through a circular aperture 300 in the lower portion 286 of modified piston part 120*a*. This is accomplished by actuating the seventh control valve 225 to connect tube 298 to the source of fluid pressure. The region enclosed between mask 22, seal ring 290, peripheral portion 131 of modified piston part 120*a*, seal ring 267, and vacuum chuck 252 is then evacuated. The enclosed region is evacuated through a passageway 302 extending through chuck plate 254, communicating with the upper surface of the chuck plate between the outer periphery of the chuck plate and both the perforated top plate 264 and wafer 54 supported thereon, and communicating with a flexible tube 304 passing through circular apertures 306 in the upper and lower portions 278 and 286 of modified piston part 120a and passing through a slot 308 in cylindrical wall 118 of the chuck holder. This is accomplished by actuating the eighth control valve 229 to connect tube 304 to the source of fluid pressure. Evacuation of the enclosed region clamps vacuum chuck 252, wafer 54 supported thereon, and mask 22 together thereby holding the mask and the wafer in intimate contact for contact printing.

Once vacuum chuck 252, wafer 54, and mask 22 are clamped together, tube 127 and, hence, chamber 124 may be vented to the atmosphere to remove the fluid drive pressure from piston 120 and vacuum chuck 252 thereby equalizing the pressure applied to mask 22 and wafer 54. As long as fluid pressure continues to be applied through tube 298 and vacuum continues to be drawn through tubes 304 and 274, vacuum chuck 252 and cylindrical part 256 will remain in the raised contact printing position with vacuum chuck 252 and wafer 54 supported thereon clamped to mask 22 and with cylindrical part 256 clamped to vacuum chuck 252. Flat springs 280 and 282 attached between cylindrical part 256 and modified piston part 120*a* will prevent piston 120 from travelling downward to the intermediate pattern alignment position.

When the contact printing operation is finished vacuum chuck 252 and wafer 54 supported thereon are returned to the lowered wafer loading and unloading position by actuating the seventh and eighth control valves 225 and 229 to vent tubes 298 and 304 to the atmosphere thereby unclamping vacuum chuck 252 and wafer 54 supported thereon from mask 22, by actuating the fifth control valve 147 to vent tube 146 to the atmosphere thereby unclamping locking device 136 from piston 120, and by actuating the fourth control valve 129 to vent tube 127 to the atmosphere (if not already done) or connect it to the source of vacuum thereby lowering piston 120 and, hence, vacuum chuck 252 and wafer 54 supported thereon. Once vacuum chuck 252 and wafer 54 supported thereon are returned to the lowered wafer loading and unloading position, the sixth control valve 197 is actuated to vent tube 274 to the atmosphere and thereby permit sliding movement of the wafer across the upper surface of the vacuum chuck.

Figure 8:
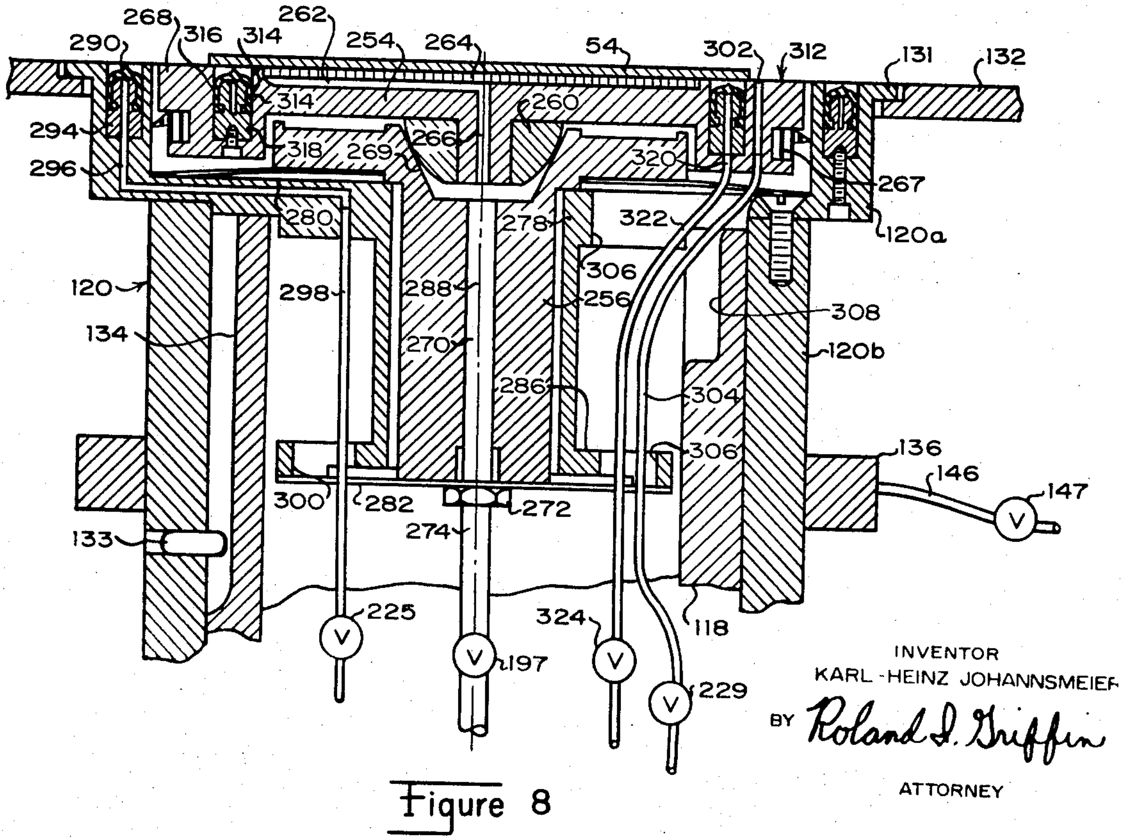

Referring now to FIG. 8, there is shown a vacuum chuck 312 according to still another of the preferred embodiments of this invention. Vacuum chuck 312 may also be employed in optical alignment and contact printing system 10 of FIG. 1 in place of vacuum chuck 52. In addition to the parts described above in connection with vacuum chuck 252 of FIG. 7 and therefore represented in FIG. 8 by the same reference numerals used for them in FIG. 7, vacuum chuck 312 includes a second inflatable seal ring 314 of the same type as the first inflatable seal ring 290. The second inflatable seal ring 314 is fixedly mounted in an annular channel 316 formed in the wafer bearing upper surface of the peripheral portion 268 of chuck plate 254 around perforated top plate 264 and beneath a peripheral portion of the lower surface of wafer 54. It is held in place by a retainer 318 in the same manner as the first inflatable seal ring 290 and is also normally deflated and retracted from the wafer bearing upper surface of chuck plate 254 so as not to interfere with wafer loading and unloading in the plane of this wafer bearing surface when vacuum chuck 312 is in the lowered wafer loading and unloading position.

When vacuum chuck 312 and wafer 54 supported thereon are driven upward to the raised parallel plane alignment and contact printing position by piston 120 in preparation for contact printing, the first inflatable seal ring 290 is inflated to sealingly engage an unused marginal portion of the lower surface of mask 22 in the same manner as described above in connection with vacuum chuck 252 of FIG. 7. Concomitantly, the second inflatable seal ring 314 is inflated to sealingly engage a concentric peripheral portion of the lower surface of wafer 54 by applying fluid pressure through a passageway 320 formed in peripheral portion 268 of chuck plate 254 and communicating with the interior of seal ring retainer 318 and with a flexible tube 322 passing through apertures 306 in the upper and lower portions 278 and 286 of modified piston part **120*a* and slot 308 in cylindrical wall 118 of the chuck holder. This is accomplished by actuating a ninth control valve 324 to connect tube 322 to the source of fluid pressure. The region enclosed between mask 22, the first inflatable seal ring 290, peripheral portion 131 of modified piston part 120*a*, seal ring 267, the portion of vacuum chuck 312 between seal rings 267 and 314, the second inflatable seal ring 314, and wafer 54 is thereupon evacuated. This is accomplished by actuating the eighth control valve 229 to connect tube 304 and, hence, the enclosed region to the source of vacuum. Evacuation of the enclosed region clamps vacuum chuck 312, wafer 54 supported thereon, and mask 22** together thereby holding the mask and the wafer in intimate contact for contact printing.

Once vacuum chuck 312, wafer 54, and mask 22 are clamped together, the fourth and sixth control valves 129 and 197 may be actuated to vent tubes 127 and 196 to the atmosphere thereby removing both the fluid drive pressure applied to piston 120, and hence, vacuum chuck 312 and the vacuum applied to the lower surface of wafer 54. This equalizes the pressure applied to the upper surface of mask 22 and the lower surface of wafer 54. When both the fluid drive pressure applied to piston 120 and the vacuum applied to the lower surface of wafer 54 are removed, piston 120 and cylindrical part 256 both travel downward to the intermediate pattern alignment position where locking device 136, which is then clamped to the piston by application of fluid pressure to tube 146, abuts upon adjustable stop ring 150. However, vacuum chuck 312 and wafer 54 supported thereon remain clamped to mask 22 in the raised contact printing position as long as fluid pressure continues to be applied through tubes 298 and 322 and vacuum continues to be drawn through tube 304. Once the contact printing operation is finished, vacuum chuck 312 and wafer 54 may be unclamped from mask 22 and returned to the lowered wafer loading and unloading position in the same manner as described above in connection with vacuum chuck 242 of FIGS. 5 and 6.

I claim:

1. Apparatus for use in aligning a first element with respect to a second element and for clamping the first and second elements together after they are aligned, said apparatus comprising:
   - first means for holding the first element on an element bearing surface thereof;
   - second means for holding the second element;
   - one of said first and second means being movable between a first position away from the other and a second position closer to the other;
   - third means for relatively moving the first and second means in substantially parallel planes to align the first element with respect to the second element;
   - fourth means normally retracted from the element bearing surface of the first means and operable for sealingly engaging both the first means and one of the second means and second element around the first element when said one of the first and second means is in the second position; and
   - fifth means for at least partially evacuating a region enclosed between the first means, the second element, and the fourth means when it sealingly engages both the first means and said one of the second means and second element around the first element to clamp the first and second elements together after they are aligned.

2. Apparatus as in claim 1 wherein:
   - said apparatus includes sixth means normally retracted from the element bearing surface of the first means and operable for sealingly engaging both the first means and a peripheral portion of the first element when said one of the first and second means is in the second position; and
   - said fifth means is operable for at least partially evacuating a region enclosed between the fourth means when it sealingly engages both said first means and said one of the second means and second element around the first element, the sixth means when it sealingly engages both the first means and the peripheral portion of the first element, a portion of the first means between the fourth and sixth means, the first element, and the second element to clamp the first and second elements together after they are aligned.

3. Apparatus as in claim 1 wherein said fourth means is supported by one of the first and second means and is normally retracted from the element bearing surface of the first means to permit the first element to be loaded onto and unloaded from the first means along the element bearing surface thereof when said one of the first and second means is in the first position.

4. Apparatus as in claim 1 wherein:
   - said first means comprises chuck means for holding a workpiece comprising the first element on a plane surface of the chuck means;
   - said second means comprises holder means for holding a mask comprising the second element;
   - said first means further comprises drive means for moving the chuck means between the first position away from the holder means and the second position closer to the holder means;
   - said chuck means is supported by the drive means for pivotal movement to orient a first surface of the workpiece and an adjacent first surface of the mask in substantially parallel planes when these adjacent surfaces are brought into abutment;
   - said third means is operable for relatively moving the chuck means and the holder means in substantially parallel planes when the chuck means is in a third position between the first and second positions to align the workpiece with respect to the mask;
   - said fourth means comprises a first resilient seal supported by one of the chuck means and drive means around the workpiece but normally retracted from the plane of the workpiece bearing surface of the chuck means;
   - said first resilient seal is operable for sealingly engaging both said one of the chuck means and drive means and one of the holder means and mask around the workpiece when the chuck means is in the second position;
   - said fifth means includes a conduit communicating with the region enclosed between the chuck means, the mask, and the first resilient seal when it sealingly engages both said one of the chuck means and drive means and said one of the holder means and mask around the workpiece; and
said fifth means is operable for at least partially evacuating this region to clamp the workpiece and the mask together.

5. Apparatus as in claim 4 wherein:
said apparatus includes a workpiece loading and unloading platform lying in substantially the same plane as the workpiece bearing surface of the chuck means; and
said first resilient seal is normally retracted from the plane of the workpiece bearing surface of the chuck means to permit the workpiece to be loaded onto and unloaded from the chuck means along and parallel to the plane of the workpiece loading and unloading platform and the workpiece bearing surface of the chuck means when the chuck means is in the first position.

6. Apparatus as in claim 4 wherein:
said chuck means comprises a wafer chuck for holding a semiconductive wafer comprising the workpiece on a plane surface of the wafer chuck;
said holder means comprises a mask holder for holding the mask, said mask holder being supported above the wafer chuck;
said apparatus includes optical means for viewing the wafer and the mask held by the wafer chuck and the mask holder, respectively, while the wafer and the mask are being aligned; and
said apparatus includes means for exposing a photosensitive film on the first surface of the wafer through the mask after the wafer and the mask are aligned and while they are clamped together.

7. Apparatus as in claim 4 wherein:
said first resilient seal comprises a first inflatable seal ring supported by the chuck means around the workpiece; and
said apparatus includes means for inflating the first inflatable seal ring to sealingly engage a marginal portion of the mask when the chuck means is in the second position.

8. Apparatus as in claim 4 wherein:
said first resilient seal comprises a first inflatable seal ring supported by said drive means around the workpiece; and
said apparatus includes means for inflating the first inflatable seal ring to sealingly engage a marginal portion of the mask when the chuck means is in the second position.

9. Apparatus as in claim 8 including:
sixth means for preventing relative movement between the chuck means and the drive means except by a limited amount along a common vertical axis; and
seventh means supported by one of the chuck means and drive means for slidably sealingly engaging the other of the chuck means and drive means;
said fifth means being operable for at least partially evacuating a region enclosed between the drive means, the seventh means, the chuck means, the mask, and the first inflatable seal ring when it is inflated to sealingly engage the marginal portion of the mask to clamp the workpiece and the mask together after they are aligned.

10. Apparatus as in claim 9 wherein:
said chuck means comprises a first member for holding the workpiece on a plane surface of the first member;
said chuck means further comprises a second member for supporting the first member;
said sixth means comprises means for clamping the first and second members together;
said sixth means further comprises one or more spring elements attached to both the second member and the drive means for preventing relative movement therebetween except by a limited amount along the common vertical axis; and
said seventh means comprises a resilient seal ring supported by the first member for slidably sealingly engaging the drive means.

11. Apparatus as in claim 4 wherein:
said apparatus includes a second resilient seal supported by one of the chuck means and drive means;
said second resilient seal is normally retracted from the plane of the workpiece bearing surface of the chuck means and is operable for sealingly engaging both a peripheral portion of the workpiece and said one of the chuck means and drive means when the chuck means is in the second position; and
said fifth means is operable for at least partially evacuating a region enclosed between the first resilient seal when it sealingly engages both said one of the chuck means and drive means and said one of the holder means and mask, the second resilient seal when it sealingly engages both the peripheral portion of the workpiece and said one of the chuck means and drive means, a portion of the chuck means between the first and second resilient seals, the workpiece, and the mask to clamp the workpiece and the mask together after they are aligned.

12. Apparatus as in claim 11 wherein:
said first resilient seal comprises a first inflatable seal ring supported by said chuck means around the workpiece;
said second resilient seal comprises a second inflatable seal ring supported by said chuck means within the first inflatable seal ring and adjacent to the peripheral portion of the workpiece; and
said apparatus includes means for inflating the first inflatable seal ring to sealingly engage a marginal portion of the mask when the chuck means is in the second position and for inflating the second inflatable seal ring to sealingly engage the peripheral portion of the workpiece when the chuck means is in the second position.

13. Apparatus as in claim 11 wherein:
said first resilient seal comprises a first inflatable seal ring supported by said drive means around the workpiece;
said second resilient seal comprises a second inflatable seal ring supported by said chuck means within the first inflatable seal ring and adjacent to the peripheral portion of the workpiece; and
said apparatus includes means for inflating the first inflatable seal ring to sealingly engage a marginal portion of the mask when the chuck means is in the second position and for inflating the second inflatable seal ring to sealingly engage the peripheral portion of the workpiece when the chuck means is in the second position.

14. Apparatus as in claim 13 including:
sixth means for preventing relative movement between the chuck means and the drive means except by a limited amount along a common vertical axis; and
seventh means supported by one of the chuck means and drive means for slidably sealingly engaging the other of the chuck means and drive means;
said fifth means being operable for at least partially evacuating a region enclosed between the first inflatable seal ring when it is inflated to sealingly engage the marginal portion of the mask, the second inflatable seal ring when it is inflated to sealingly engage the peripheral portion of the workpiece, a portion of the drive means and chuck means between the first and second inflatable seal rings, the seventh means, the workpiece, and the mask to clamp the workpiece and the mask together after they are aligned.

15. Apparatus as in claim 14 wherein:
said chuck means comprises a first member for holding the workpiece on a plane surface of the first member;
said chuck means further comprises a second member for supporting the first member;
said sixth means comprises means for clamping the first and second members together;
said sixth means further comprises one or more spring elements attached to both the second member and the drive means for preventing relative movement therebetween except by a limited amount along the common vertical axis; and
said seventh means comprises a resilient seal ring supported by the first member for slidably sealingly engaging the drive means.

16. In a mask alignment instrument apparatus for engaging a semiconductive wafer with a mask, said apparatus comprising:
a base;
a mask holder mounted on said base for holding the mask;
a chuck carrier mounted on said base for vertical movement relative to said mask holder;
a wafer chuck for holding the wafer on a surface thereof;
said wafer chuck being supported by said chuck carrier for vertical movement therewith to position the wafer in contact with the mask;
a first seal supported by said wafer chuck and normally retracted from the wafer bearing surface thereof;
said first seal being operable for sealingly engaging both said wafer chuck and a marginal portion of the mask around the wafer;
an aperture in said wafer chuck; and
means connected to said aperture for at least partially evacuating a region bounded by said first seal, said wafer chuck, and said mask to clamp the wafer and the mask together.

17. Apparatus as in claim 16 wherein:
said first seal comprises a first inflatable seal ring supported by said wafer chuck around the wafer; and
said apparatus includes means for inflating said first inflatable seal ring to sealingly engage the marginal portion of the mask.

18. Apparatus as in claim 16 wherein:
said apparatus includes a second seal supported by said wafer chuck, positioned within said first seal, and normally retracted from the wafer bearing surface of said wafer chuck;
said second seal is operable for sealingly engaging both said wafer chuck and a peripheral portion of the wafer; and
said means is operable for at least partially evacuating a region bounded by said first seal, said second seal, a portion of said wafer chuck between said first and second seals, the wafer, and the mask to clamp the wafer and the mask together.

19. Apparatus as in claim 18 wherein:
said first seal comprises a first inflatable seal ring supported by said wafer chuck around the wafer;
said second seal comprises a second inflatable seal ring supported by said wafer chuck adjacent to a peripheral portion of the wafer; and
said apparatus includes means for inflating said first inflatable seal ring to sealingly engage the marginal portion of the mask and for inflating said second inflatable seal ring to sealingly engage the peripheral portion of the wafer.

20. In a mask alignment instrument apparatus for engaging a semiconductive wafer with a mask, said apparatus comprising:
a base;
a mask holder mounted on said base for holding the mask;
a chuck carrier mounted on said base for vertical movement relative to said mask holder;
a wafer chuck for holding the wafer on a surface thereof;
said wafer chuck being supported by said chuck carrier for vertical movement therewith to position the wafer in contact with the mask;
a first seal supported by said chuck carrier around said wafer chuck and normally retracted from a plane including the wafer bearing surface of said wafer chuck;
said first seal being operable for sealingly engaging both said chuck carrier and a marginal portion of the mask around the wafer; and
first means for at least partially evacuating a region bounded by said first seal, said chuck carrier, said wafer chuck, and said mask to clamp the wafer and the mask together.

21. Apparatus as in claim 20 wherein:
said first seal comprises a first inflatable seal ring supported by said chuck carrier around said wafer chuck; and
said apparatus includes second means for inflating said first inflatable seal ring to sealingly engage the marginal portion of the mask.

22. Apparatus as in claim 21 including:
third means for preventing relative movement between said wafer chuck and said chuck carrier except by a limited amount along a common vertical axis; and
a second seal supported by one of said wafer chuck and chuck carrier for slidably sealingly engaging the other of said wafer chuck and chuck carrier;
said first means being operable for at least partially evacuating a region bounded by said first inflatable seal ring, said chuck carrier, said second seal, said wafer chuck, and said mask to clamp the wafer and the mask together.

23. Apparatus as in claim 20 wherein:

said apparatus includes a second seal supported by said wafer chuck and normally retracted from the wafer bearing surface of said wafer chuck;

said second seal being operable for sealingly engaging both said wafer chuck and a peripheral portion of the wafer; and said first means is operable for at least partially evacuating a region bounded by said first seal, said second seal, a portion of said chuck carrier and wafer chuck between said first and second seals, the wafer, and the mask to clamp the wafer and the mask together.

24. Apparatus as in claim 23 wherein:

said first seal comprises a first inflatable seal ring supported by said chuck carrier around said wafer chuck;

said second seal comprises a second inflatable seal ring supported by said wafer chuck adjacent to a peripheral portion of the wafer; and said apparatus includes second means for inflating said first inflatable seal ring to sealingly engage the marginal portion of the mask and for inflating said second inflatable seal ring to sealingly engage the peripheral portion of the wafer.

25. Apparatus as in claim 24 including:

third means for preventing relative movement between said wafer chuck and said chuck carrier except by a limited amount along a common vertical axis; and a third seal ring supported by one of said wafer chuck and chuck carrier for slidably sealingly engaging the other of said wafer chuck and chuck carrier;

said first means being operable for at least partially evacuating a region bounded by said first inflatable seal ring, said second inflatable seal ring, said third seal ring, a portion of said chuck carrier and wafer chuck between said first and second inflatable seal rings, the wafer, and the mask to clamp the wafer and the mask together.

26. In a mask alignment instrument apparatus for engaging a semiconductive wafer with a mask, said apparatus comprising:

a base;

a mask holder mounted on said base for holding the mask;

a chuck carrier mounted on said base for vertical movement relative to said mask holder;

a wafer chuck for holding the wafer on a surface thereof;

said wafer chuck being supported by said chuck carrier for vertical movement therewith to position the wafer in contact with the mask;

a first seal supported by one of said chuck carrier and wafer chuck for sealingly engaging said one of said chuck carrier and wafer chuck and a marginal portion of the mask around the wafer;

a second seal supported by one of said chuck carrier and wafer chuck for sealingly engaging said one of said chuck carrier and wafer chuck and a peripheral portion of the wafer; and first means for at least partially evacuating a region bounded by said first and second seals, a portion of said chuck carrier and wafer chuck between said first and second seals, the wafer, and the mask to clamp the wafer and the mask together.

27. Apparatus as in claim 26 wherein:

said first seal comprises a first inflatable seal ring supported by said wafer chuck around the wafer;

said second seal comprises a second inflatable seal ring supported by said wafer chuck adjacent to the peripheral portion of the wafer; and said apparatus includes second means for inflating said first inflatable seal ring to sealingly engage the marginal portion of the mask and for inflating said second inflatable seal ring to sealingly engage the peripheral portion of the wafer.

28. Apparatus as in claim 26 wherein:

said first seal comprises a first inflatable seal ring supported by said chuck carrier around said wafer chuck;

said second seal comprises a second inflatable seal ring supported by said wafer chuck adjacent to the peripheral portion of the wafer; and said apparatus includes second means for inflating said first inflatable seal ring to sealingly engage the marginal portion of the mask and for inflating said second inflatable seal ring to sealingly engage the peripheral portion of the wafer.

29. Apparatus as in claim 28 including:

third means for preventing relative movement between said wafer chuck and said chuck carrier except by a limited amount along a common vertical axis; and fourth means supported by one of said chuck carrier and wafer chuck for slidably sealingly engaging the other of said chuck carrier and wafer chuck;

said first means being operable for at least partially evacuating a region bounded by said first inflatable seal ring, said second inflatable seal ring, said fourth means, a portion of said chuck carrier and wafer chuck between said first and second inflatable seal rings, the wafer, and the mask to clamp the wafer and the mask together.

30. Apparatus as in claim 29 wherein:

said wafer chuck comprises a first member for holding the wafer on a surface thereof;

said wafer chuck further comprises a second member for supporting the first member;

said third means comprises means for clamping the first and second members together;

said third means further comprises one or more spring elements attached to both said second member and said chuck carrier for preventing relative movement therebetween except by a limited amount along the common vertical axis; and said fourth means comprises a third seal ring supported by said wafer chuck for slidably sealingly engaging said chuck carrier.

* * * * *